(12) United States Patent
Lee et al.

(10) Patent No.: US 7,070,714 B2
(45) Date of Patent: Jul. 4, 2006

(54) SELF-ARRAYED HOLE-CARRYABLE POLYMERS USED FOR ORGANIC PHOTO-REFRACTIVE MATERIALS AND PHOTO-REFRACTIVE MIXTURE CONTAINING THEM

(75) Inventors: Suck-Hyun Lee, 19-9 Joongang-dong, Gwacheon-si, Gyeonggi-do (KR); Chan-Woo Lee, 136-104 Hwanggol Jookong Apt., Youngton-dong, Paldal-gu, Suwon-si, Gyeonggi-do (KR); Ho-Sung Yoon, 311-1201 Hyojachon, Seohyun-dong, Boondang-gu, Sungnam-si, Gyeonggi-do (KR); Young-Bum Kim, Seoul (KR); O-Pil Kwon, Gyeonggi-do (KR)

(73) Assignees: Suck-Hyun Lee, Gwacheon-si (KR); Chan-Woo Lee, Suwon-si (KR); Ho-Sung Yoon, Sungnam-si (KR)

( * ) Notice: Subject to any disclaimer, the term of this patent is extended or adjusted under 35 U.S.C. 154(b) by 564 days.

(21) Appl. No.: 10/210,335

(22) Filed: Aug. 1, 2002

(65) Prior Publication Data
US 2003/0197158 A1    Oct. 23, 2003

(30) Foreign Application Priority Data
Feb. 27, 2002    (KR)    ................ 2002-10432

(51) Int. Cl.
*G02B 5/30*    (2006.01)
*G02B 27/28*    (2006.01)

(52) U.S. Cl. .................. 252/582; 359/487; 359/488
(58) Field of Classification Search ............... 252/582
See application file for complete search history.

(56) References Cited

U.S. PATENT DOCUMENTS

| | | | | |
|---|---|---|---|---|
| 4,125,534 | A | * | 11/1978 | Yee ........................ 548/440 |
| 5,063,125 | A | * | 11/1991 | Yuh et al. ............... 430/58.75 |
| 5,064,264 | A | * | 11/1991 | Ducharme et al. ......... 385/130 |
| 6,090,332 | A | * | 7/2000 | Marder et al. ............ 264/435 |
| 6,452,092 | B1 | * | 9/2002 | Han et al. ................. 136/263 |
| 6,653,421 | B1 | * | 11/2003 | Yamamoto et al. ........ 526/259 |
| 2001/0017155 | A1 | * | 8/2001 | Bellmann et al. ......... 136/263 |
| 2002/0103332 | A1 | * | 8/2002 | Leclerc et al. ............ 528/423 |

* cited by examiner

*Primary Examiner*—Randy Gulakowski
*Assistant Examiner*—Timothy J. Kugel

(57) ABSTRACT

A novel self-arrayed hole-carryable polymer having rigid backbone of high-ordered self-orienting layer structure, i.e. polyester, polyamide or biphenyl series polyester and flexible side chain, i.e. carbazole derivatives inducing hole-carryable characteristic group and exhibiting high thermo-stability, plain processibility and high photoconductivity; and A photo-refractive material comprising the photo-refractive material, charge producer and nonlinear optical characteristic group as electro-optical material and exhibiting enhanced photoconductivity without adding plasticizer.

5 Claims, 2 Drawing Sheets

[FIG. 1]
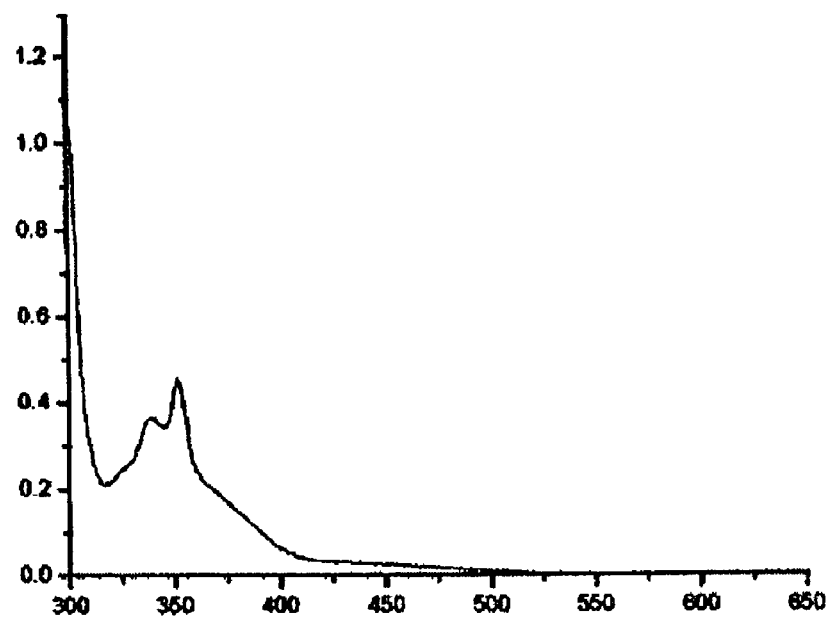
[FIG. 2]
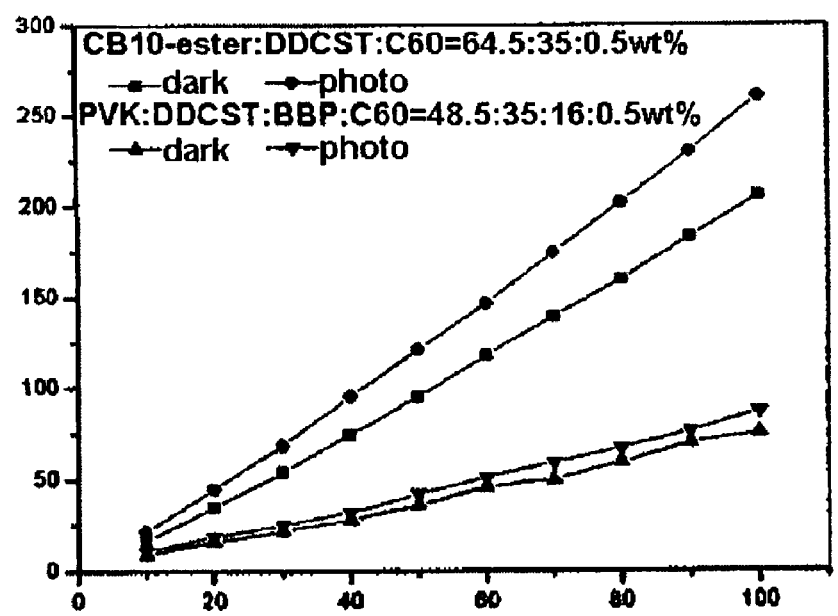

[FIG. 3]
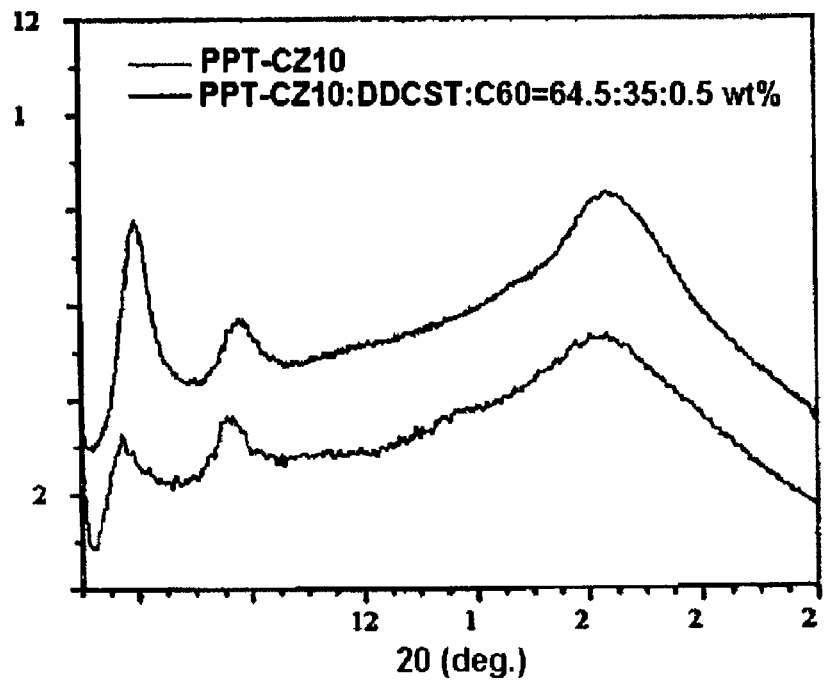
[FIG. 4]
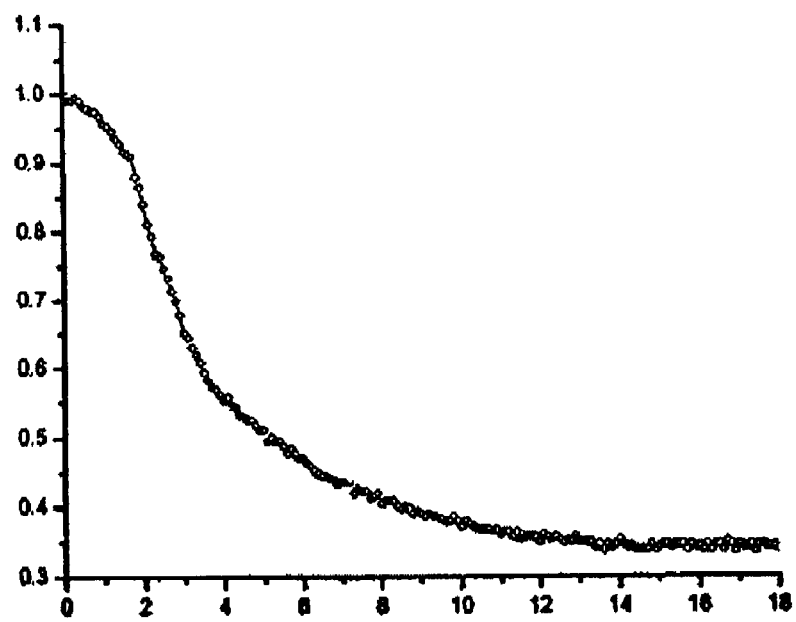

SELF-ARRAYED HOLE-CARRYABLE POLYMERS USED FOR ORGANIC PHOTO-REFRACTIVE MATERIALS AND PHOTO-REFRACTIVE MIXTURE CONTAINING THEM

CROSS REFERENCE TO RELATED APPLICATION

This application claims the benefit of Korean Patent Application No. 2002-10432, filed on Feb. 27, 2002 in Korea, which is hereby incorporated by reference for all purposes as if fully set forth herein.

BACKGROUND OF THE INVENTION

1. Field of the Invention

The present invention relates to novel self-arrayed polymers and more particularly, to self-arrayed polymers with an excellent hole-carryable property and mixtures for manufacturing photo-refractive/photo-breaking elements containing them as a hole-carryable material.

2. Description of the Related Art

Conventionally polymers, such as poly (p-phenylenevinylene) (hereinafter referred to as PPV), polythiophene, polyvinylcarvazole (hereinafter referred to as PVK) and the like, and tertiary amine derivatives such as tetraphenylbiphenyldiamine (hereinafter referred to as TPD) or TPD species were mainly used as organic hole-carryable materials. The problems of low thermo-stability and recrystallization are resulted from using TPD and its derivatives as a hole-carryable material because of their low glass transition points.

Also, the process of adding electro-optical pigments into the medium of photoconductive polymer was mainly used in case the hole-carryable photoconductive polymers were used as organic photo-refractive material. At this time, PVK or polysilane was typically used as polymers. But, Polymers such as PKV has a disadvantage of bad processability and low photo-refraction efficiency resulting from high glass transition point of over 200° C. To overcome this problem, it developed process for using plasticizers and additives for enhancing the photo-refraction efficiency by lowing glass transition point less than room temperature.

But said process had also serious problem of phase isolation owing to added plasticizers and of low relative electro-chemical characteristic groups and concentration of hole-carriers, which resulted in low photo-refraction efficiency.

For the foregoing reasons, there is a need for hole-carryable polymer with high glass transition point, thermo-stability that can be easily processed.

SUMMARY OF THE INVENTION

The present invention is directed to a hole-carryable polymer that substantially satisfies the need.

An object of the present invention is to provide a novel hole-carryable polymer having self hole-carryability and excellent mechanical, thermal properties. The polymer has a rigid backbone with high-ordered self-orienting layer structure and flexible side chain which induces hole-carryable characteristic group. As a result, the polymer has high thermostability originated from rigid backbone and plain processability and fast reactivity and high photoconductivity based upon low glass transition point (Tg) originated from flexible side chain.

Another object of the present invention is to provide a photo-refractive mixture having said polymer with excellent photoconductivity and low Tg. Accordingly, the mixture has high contents of electro-optical characteristic group and excellent photo refractivity without adding plasticizer.

In a first aspect, the present invention provides a Self-arrayed polymer exhibiting hole-carryability and formula 1 below:

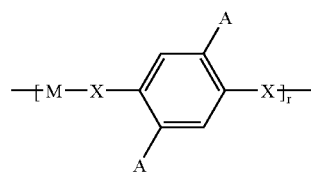

[Formula 1]

wherein A is a chromophore (hole-carryable characteristic group), which is selected from the compound showing in Formula 2 or Formula 3 below:

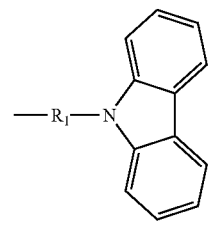

[Formula 2]

wherein $R_1$ is selected from the group of —O—$(CH_2)_q$— (q is an integer from 1 to 20), —S—$(CH_2)_m$— (m is an integer from 1 to 20),

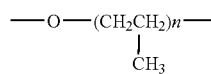

(n is an integer from 1 to 5) or

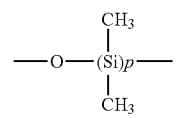

(p is an integer from 1 to 5); and

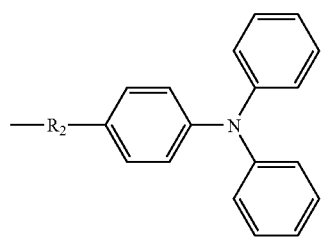

[Formula 3]

or

-continued

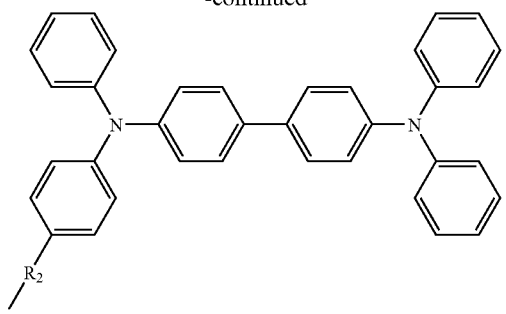

wherein $R_2$ is selected from the group of —O—$(CH_2)_v$—O— (v is an integer from 1 to 20), —S—$(CH_2)_w$—S— (w is an integer from 1 to 20),

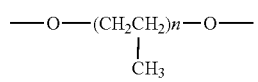

(n is an integer from 1 to 5) or

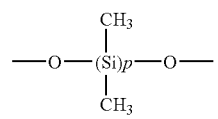

(p is an integer from 1 to 5):
r is an integer from 3 to 300 as polymerization degree;
X is selected from:

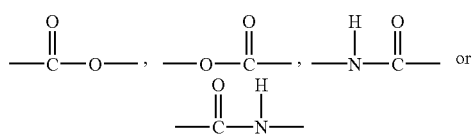

and
M is a selected from 1) to 4) below as a co-monomer.
1)

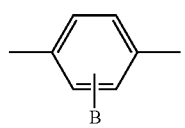

(wherein B is H, Cl, Br or $CH_3$);
2)

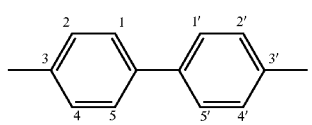

(wherein said compound is 1,1'-, 2,2'-, 3,3'-, 4,4'-, 1,3'-, 1,2'-, 2,3'-, 2,4'- or 3,4'-biphenyl series isomers);
3)

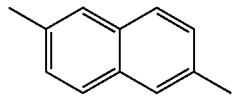

(wherein said compound is 1,4-, 1,5-, 1.6-, 1,7-, 2,3-, 2,5-, 2,6- or 2,7- naphthalene series isomers); and
4)

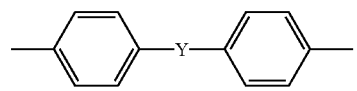

(wherein Y is O, $CH_2$, $SO_2$, S,

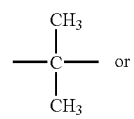

or

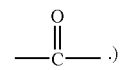

.)

In another aspect, the present invention provides a photorefractive mixture resulted from the self-arrayed polymers as a medium using host-guest system which disperses charge-producer and electro-optical material.

These and other features, aspects, and advantages of the present invention will become better understood with reference to the following description and appended claims.

BRIEF DESCRIPTION OF THE DRAWINGS

The accompanying drawings, which are included to provide a further understanding of the invention and are incorporated in and constitute a part of this specification, Illustrate embodiments of the invention and together with the description serve to explain the principles of the invention FIG. 1 is a graph showing absorbance spectrum in the field of UV and visible light for (PPT-CZ10 (poly(p-phenylene terephthalate) carbazole with a methylene spacer length n=10)) synthesized in Example 4 of the present invention;

FIG. 2 is a graph comparing the photoconductivity of photo element (PPT-CZ10 (poly(p-phenylene terephthalate) carbazole with a methylene spacer length n=10): DDCST (diethylaminocyanostyrene):C60=64.5:35:0.05) manufactured in Example 7 of the present invention with that of photo element (PVK (poly(N-vinyl carbazole):DDCST:BBP (benzylbutylphthlate):C60=48.5:35:16:0.5) in prior art;

FIG. 3 is a graph showing RXD (X-ray diffraction) analysis result of polyester (PPT-CZ10) manufactured in Example 4 and photo-refractive mixture (PPT-CZ10:DDCST:C60=64.5:35:0.5) manufactured in Example 8 of the present invention; and FIG. 4 is a graph illustrating the measurement result of photo-breaking effect for the photo-refractive mixture (PPT-CZ10:DDCST:C60=64.5:35:0.5) of the present invention according to Example 9 of the present invention.

DETAILED DESCRIPTION OF THE ILLUSTRATED EMBODIMENTS

Reference will now be made in detail to the illustrated embodiment of the present invention, which is illustrated in the accompanying drawings.

The novel hole-carryable polymer of the present invention is composed of the repeat-unit structure shown in formula 1 below:

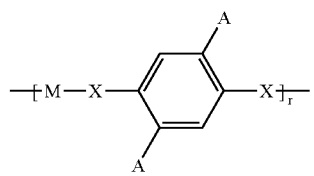

[Formula 1]

wherein A is a chromophore (hole-carryable characteristic group), which is selected from the compound shown in Formula 2 or Formula 3 below:

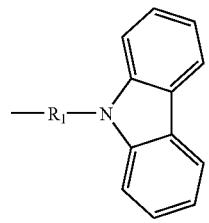

[Formula 2]

wherein $R_1$ is —O—(CH$_2$)$_q$— (q is an integer from 1 to 20), —S—(CH$_2$)$_m$— (m is an integer from 1 to 20),

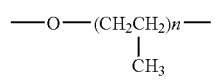

(n is an integer from 1 to 5) or

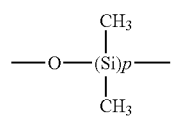

(p is an integer from 1 to 5); and

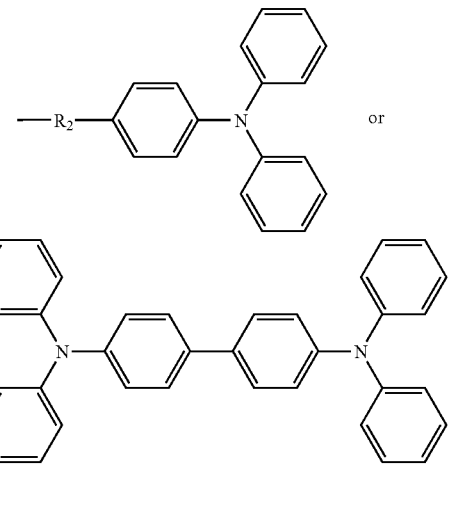

[Formula 3]

wherein $R_2$ is —O—(CH$_2$)$_v$—O— (v is an integer from 1 to 20), —S—(CH$_2$)$_w$—S— (w is an integer from 1 to 20),

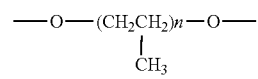

(n is an integer from 1 to 5) or

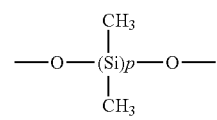

(p is an integer from 1 to 5):
r is an integer from 3 to 300 as polymerization degree:
X is selected from:

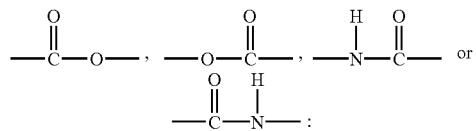

and
M is a selected from the group composed of 1) to 4) below as a co-monomer.
1)

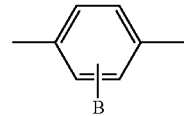

(wherein B is H, Cl, Br or CH₃);

2)

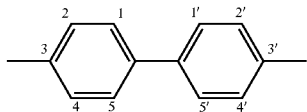

(wherein said compound is 1,1'-, 2,2'-, 3,3'-, 4,4'-, 1,3'-, 1,2'-, 2,3'-, 2,4'- or 3,4'-biphenyl series isomers);

3)

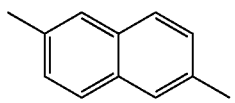

(wherein said compound is 1,4-, 1,5-, 1.6-, 1,7-, 2,3-, 2,5-, 2,6- or 2,7-naphthalene series isomers); and

4)

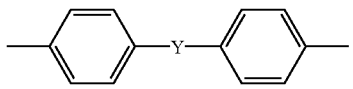

(wherein Y is O, CH₂, SO₂, S,

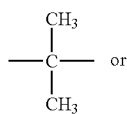 or or

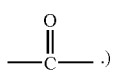.)

Following is a representative description of synthesis process of polymer comprising 2,5-di[(N-carbazole)dekyl] terephthalic acid among self-arrayed polymers shown in above Formula 1.

Carbazole(I) and 1,10-dibromodecane(II), which is flexible matrix, is reacted to synthesize (N-carbazole)-10-bromodecane(III), which was reacted into diethyl-2,5-dihydroxy-terephthalate(IV) to synthesize diethyl-2,5-di[(N-carbazole)decyl] terephthalate(V). Diethyl0-2,5-[(N-carbazole)decyl] terephthalate(V) was refluxed in basic solution and treated with acid to produce the final product, 2,5,-di[(N-carbazole)decyl]terephthalic acid(VI).

The above-mentioned synthesis process is shown briefly in the following Reaction 1 to Reaction 3.

[Reaction 1]

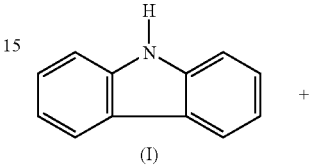

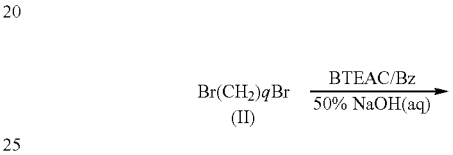

[Reaction 2]

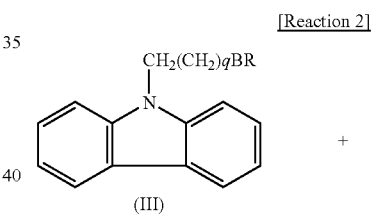

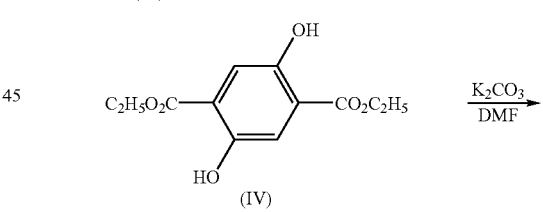

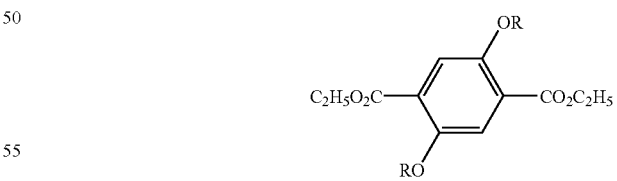

[Reaction 3]

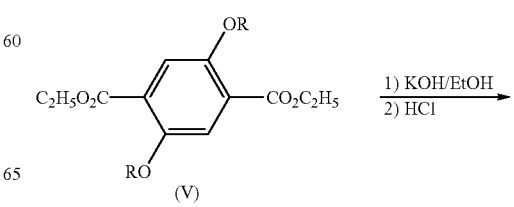

-continued

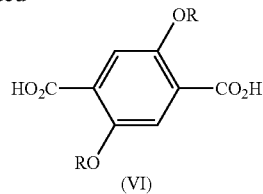

(VI)

wherein R is;

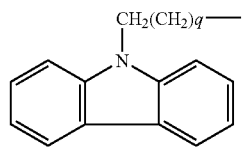

and
q is an integer from 0 to 20.

Polyester(VII), polyamide(VIII) and biphenyl series polyester(IX), which are polymers of the present invention, are synthesized plainly from said compound(VI) following Reaction 4, 5 and 6 respectively.

[Reaction 4]

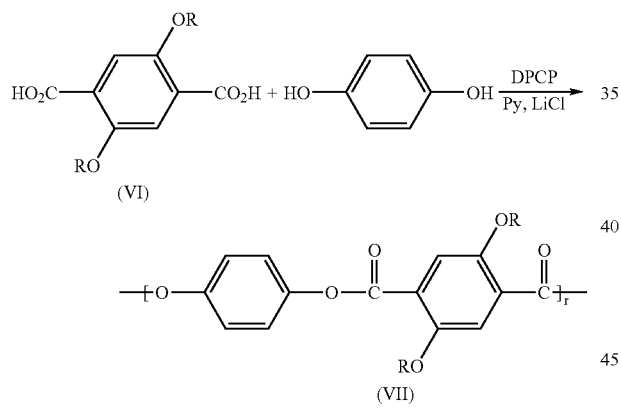

[Reaction 5]

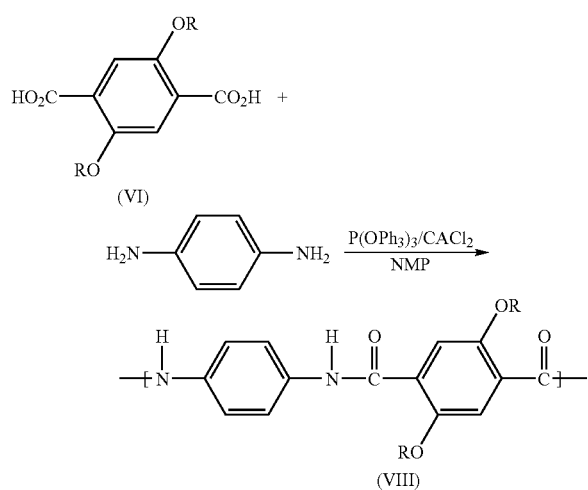

[Reaction 6]

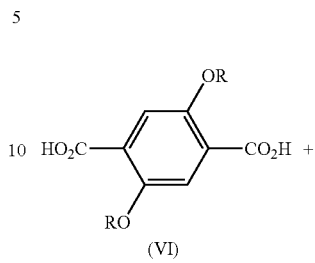

(VI)

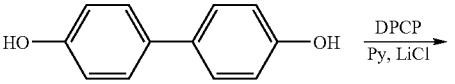

(IX)

wherein reaction 4 to 6, R is

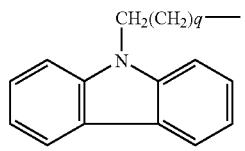

(q is an integer from 0 to 20); and r is an integer from 3 to 300 as polymerization degree.

The said polymers capable of synthesizing in the present invention have a number average molecular weight in the range of 2,000 to 240,000.

Polymers in the present invention does not make hole-carryable characteristic group crystallize in spite of exceedingly high concentration of the group and have high solubility in organic solvents. So, it is possible to manufacture film with optically excellent physical properties. Also the polymers show remarkably high photoconductivity resulted from their excellent hole-carryable property.

The present invention provides charge producer as being medium like said polymers and photo-refractive mixtures using host-guest system making electro-optical materials dispersed.

Specifically, we identified 4-fold photoconductivity, on doping the mixtures about 1% by making hole-carryable polymers shown above Formula 1 be medium and by using $C_{60}$ shown in Formula 4 or TNF (trinitro-fluoren-9-one) shown in Formula 5 as charge producer, as high as using the conventional PVK. This is extremely high value among photoconductivity of hole-carryable polymers known until present.

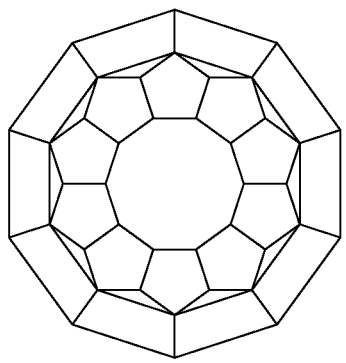

[Formula 4]

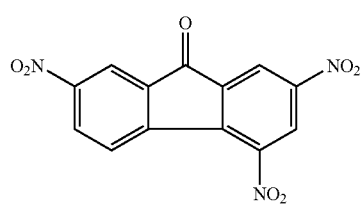

[Formula 5]

High photoconductivity of polymers of the present invention is caused by the fact that the polymers have high-ordered self-arrayed layer structures by inducing flexible side chains with hole-carryable molecule into rigid backbone, on the other hand typical hole-carryable polymers have amorphous structure. On adding electro-optical pigments into these layer structures, which causes local concentration of hole-carryable material to be increased and to enhance hole-carriability by self-array of polymers, they show high photoconductivity. Also, high glass transition point of backbone makes stability of elements increase and low glass transition point of side chain causes device to have fast reactivity, and as a result the device has enhanced processability and stability.

Also, the polymers of the present invention have an excellent hole-carryability in themselves and as a result can be used as hole-carryable layer of the organic fluorescent elements or various optical elements.

Besides, by using said polymers with high photoconductivity of the present invention, without adding other plasticizers we can manufacture photo-refractive mixtures, which have low glass transition point but do not have phase isolation, showing excellent stability, fast reaction rate and high photo-refractive property.

The photo-refractive mixtures of the present invention can be manufactured by making the photo-conductive polymers shown in above Formula 1 be medium and by using host-guest system adding nonlinear-optical characteristic group (electro-optical material) and charge producer.

At this time, we can use general nonlinear-optical characteristic group (electro-optical material) shown in following Formula 6 as an nonlinear-optical characteristic group and use compounds in above Formula 4 or 5 as charge producer.

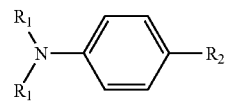

[Formula 6]

wherein $R_1$ is (C1–C10) alkyl, (C1–C10) alkyl substituted with hydroxyl group to terminal end or (C5–C10) cycloalkyl; $R_2$ is nitro group or dicyanovinyl group.

The photo-refractive elements of the present invention can be manufactured by dissolving mixtures comprising of photo-conductive polymers, nonlinear-optical characteristic group (electro-optical material) and charge producer into common solvents, dropping respectively the solution into glass coated two sheets of ITO(Indium Tin Oxide) electrode, then heating to remove the solvents. After manufacturing two electrodes with a thickness of 100 μm by putting together said two sheets of glass applied polymers, an electric line is connected to these two sheets of ITO electrode.

The photo-refractive mixtures manufactured following said process maintained layer structure with high-ordered self-orientation after doping lots of amount of nonlinear chromophore and the like. Elements using these mixtures, which have a side chain with low glass transition point, were stabilized after manufacturing them 6 months without problems of phase isolation or crystallization, which stability resulted from stability of rigid backbone and not having additives such as plasticizer. Besides, low glass transition point under room temparature showing in side chains provided high photo-refraction and reaction rate. As a result of analysis of the photo-refraction efficiency with two-beam coupling, we obtained high gains factor of 200 $cm^{-1}$ (50 V/μm). Consequently, it can be applied to the field of photo-image processing, photo-information processing, image transmission and the like by utilizing elements using these mixtures.

Also, it was determined that said photo-refractive mixture shows fanning phenomenon of dispersing more than 65% of irradiated light on applying an electric field to the elements using said photo-refractive mixtures and then irradiating light. The stronger the intensity of light, the faster the phenomenon and the stronger the intensity of electric field, the higher fanning value. Accordingly, it was certified that the photo-refractive mixtures can be used in photo-breaking elements that are able to break irradiated light.

We provide several examples to help the understanding of the present invention. The examples provided below are for easier understanding the present invention is not limited to these examples.

EXAMPLE 1

Synthesis of (N-carbazol)-10-bromodecane(III)
(Reaction 1)

In this example, we synthesized (N-carbazol)-10-bromodecane shown in Reaction 1, wherein q is 9, like following.

Carbazol 5.0 g (0.0299 mol) was placed into a 3 necked flask in the presence of nitrogen flow and dissolved in 50% NaOH aqueous solution. Benzene 15 ml and BTEAC (benzyltriethylammonium chloride) 0.25 g was added and dibromodecane 100 g was added into it slowly. After reacting said reactants at room temperature for 24 hours and extracting the product in water and methylenechloride, by separating and drying through column chromatography using mixed solvent (20/1 V/V) of hexane and ethyl acetate, (N-carbazol)-10-bromodecane was synthesized (80% yield).

The obtained product was analyzed by using NMR/IR and following is the analysis result.

$^1$H-NMR [CDCl$_3$, ppm]: 8.2(d, 2H), 7.5–7.2(m, 6H), 4.3(t, 2H), 3.4(t, 2H), 2.0–1.8(m, 4H), 1.6–1.3(m, 12H)

IR [cm$^{-1}$]: 3,100–3,000(aromatic C—H), 2,960–2,900 (aliphatic C—H), 1,350–1,000(C—N), 750, 700(aromatic OOP)

EXAMPLE 2

Synthesis of diethyl-2,5-di[(N-carbazol)decyl]terephthalate (V) (Reaction 2)

In this example, we synthesized diethyl-2,5-di[(N-carbazol)decyl]terephthalate (V) shown in Reaction 2 like following.

K$_2$CO$_3$ 1.2 g(0.009 mol) and diethyl-2,5-dihydroxy terephthalate 1.14 g(0.0045 mol) were placed into a 250 ml, 3-necked flask. After the mixture is dissolved in DMF (dimethylformate) 30 ml, (N-carbazol)-10-bromodecane 4 g(0.01 mol) produced in said example 1 was added. After heating the reacting solution at 50° C. and reacting 24 hours, the solution was filtered to remove K$_2$CO$_3$ and vacuum distilled to remove DMF. By separating and drying palebrown product through column chromatography using missed solvent of hexane and ethyl acetate (10/1 V/V), diethyl-2,5-di[(N-carbazol)decyl] terephthalate was synthesized(90% yield).

The obtained product was analyzed by using NMR/IR and following is the analysis result.

$^1$H-NMR [CDCl$_3$, ppm]: 8.1(d, 4H), 7.5–7.2(m, 14H), 4.3(m, 8H), 4.0(t, 4H), 2.0–1.7(m, 8H), 1.5–1.2(m, 30H)

IR [cm$^{-1}$]: 3,100–3,000(aromatic C—H), 2,960–2,900 (aliphatic C—H), 1,750(C=O), 1,350–1,000(C—N), 750, 700(aromatic OOP)

EXAMPLE 3

Synthesis of 2,5-di[(N-carbazol)decyl]terephthalic acid (VI) (Reaction 3)

In this example, we synthesized 2,5-di[(N-carbazol)decyl]terephthalte(VI) shown in Reaction 3 like following.

Diethyl-2,5-di[(N-carbazol)decyl]teephthalate 3.23 g(0.0037 mol) produced in the above Example was added in ethanol 100 ml and heated. Then ethanol 30 ml dissolved in KOH 0.84 g was added into the solution and the solution was refluxed for 6 hrs. After completing reaction, the mixtures were distilled under reduced pressure to remove ethanol, the resulting produced white solid dissolved in water and acidified in 2N HCl. By extracting this product with methylene glycol and recrystallizing with ethanol, pure 2,5-di[(N-carbazol)decyl]terephthalic acid was obtained (90% yield).

The obtained product was analyzed by using NMR/IR and following is the analysis result.

$^1$H-NMR [CDCl$_3$, ppm]: 11.0(s, 2H), 8.1(d, 4H), 7.8(s, 2H), 7.5–7.2(m, 12H), 4.4–4.2(m, 8H), 2.0–1.7(m, 8H), 1.5–1.2(m, 24H)

IR [cm$^{-1}$]: 3,600–2,400(—OH), 3.100–3,000(aromatic C—H), 2.960–2900(aliphatic C—H), 1,750(C=O), 1,350–1,000(C—N), 750, 700(aromatic OOP)

EXAMPLE 4

Synthesis of Polymer Polyester (VII) (Reaction 4)

In this example, we synthesized polyester (VII) polymers shown in Reaction 4 like following.

After displacing the interior of a 1000 ml, 3-necked round-bottom flask with nitrogen flow, 2,5-di[(N-carbazol)decyl]terephthalic acid 7.1 g(0.00877 mol) produced in the above example 3 was placed into this flask. After dissolving the 2,5-di[(N-carbazol)decyl]terephthalic acid in pyridine 80 ml, DPCP(diphenylcyclopropenone) 6.1 g(0.023 mol) and LiCl 0.7 g(0.02 mol) were added. After stirring the solution at 90° C. for 30 minutes, pyridine 100 ml dissolved hydroquinone 0.96 g(0.0087 mol) was added into it.

After reacting the solution at 90° C. for 6 hours and completing the reaction, the solution was poured in excessive methanol to give precipitate. After filtrating the precipitate and washing it severally with methanol and distilled water, by drying it in vacuum oven at 60° C. polyester was produced (99% yield).

The obtained product was analyzed by using NMR/IR and following is the analysis result.

$^1$H NMR [CDCl$_3$, ppm]: 8.1(d, 4H) 7.6–7.2(m, 18H), 4.3(t, 4H), 4.1(m, 4H ), 2.0–1.7(m, 8H), 1.5–1.2(m, 24H)

IR [cm$^{-1}$]: 3,100–3,000(aromatic C—H), 2,960–2,900 (aliphatic C—H), 1,750(C=O), 1,350–1,000(C—N), 820 (para-aromatic OOP)

The said produced polyester polymers have a glass transition point of 28.6° C. and number weight molecular weight of over 100,000. And absorption spectrum of UV and visible light for the said polymer (poly(p-phenylene terephthalate) carbazole) is shown in FIG. 1.

EXAMPLE 5

Synthesis of Polymer Polyamide (VII) (Reaction 5)

In this example, we synthesized polyamide (VIII) polymer shown in Reaction 5 like following.

After displacing the interior of a 1000 ml, 3-necked round-bottom flask with nitrogen flow 2,5-di[(N-carbazol)decyl]terephthalic acid 7.1 g(0.0087 mol) and CaCl$_2$ 6 g were placed into the flask. The mixture was dissolved in NMP(N-methyl-2-pyrrolidone) 80 ml and pyridine 9 ml and then paraphenyldiamine 0.94 g(0.0087 mol) was added. Into the solution was added slowly P(Oph$_3$)$_3$ 5.4 g(0.017 mol) at room temperature and reacted at 90° C. for 2 hrs. After completing the reaction, the reaction solution was poured in excessive methanol to give precipitate. After filtrating the precipitate and washing it severally with methanol and distilled water, by drying it in vacuum oven polyamide was produced (98% yield).

The obtained product was analyzed by using NMR/IR and following is the analysis result.

$^1$H-NMR [CDCl$_3$, ppm]: 8.1(d, 4H), 7.6–7.2(m, 18H), 4.3(t, 4H), 4.1(m, 4H), 2.0–1.7(m, 8H), 1.5–1.2(m, 24H)

IR [cm$^{-1}$]: 3,440(N—H), 3,100–3,000(aromatic C—H), 2,960–2,900(aliphatic C—H), 1,750(C=O), 1,350–1,000 (C—N), 820(para-aromatic OOP)

EXAMPLE 6

Synthesis of Biphenyl Series Polymer Polyester(IX) (Reaction 6)

In this example, we synthesized biphenyl series polyester (IX) in shown Reaction 6 like following.

After displacing the interior of a 1000 ml, 3-necked round-bottom flask with nitrogen flow, 2,5-di[(N-carbazol)decyl]terephthalic acid 7.1 g(0.0087 mol) produced in Example 3 was placed into the flask. After dissolving the acid pyridine 80 ml, DPCP 6.1 g(0.023 mol) and LiCl 0.7 g(0.02 mol) were added. After stirring the reaction solution at 90° C. for 30 min. pyridine 100 ml dissolved 4,4'-biphenol 1.63 g(0.0087 mol) was added into it. After reacting the solution at 90° C. for 24 hours and completing the reaction, the reaction solution was poured into excessive methanol to give precipitate. After filtrating the precipitate and washing it severally with methanol and distilled water, by drying it in vacuum oven biphenyl series polyester was produced (99% yield).

The obtained product was analyzed by using NMR/IR and following is the analysis result.

$^1$H-NMR [CDCl$_3$, ppm]: 8.1(d, 4H), 7.6–6.6(m, 22H), 4.3(t, 4H), 4.1(m, 4H), 2.0–1.7(m, 8H), 1.5–1.2(m, 24H)

IR [cm$^{-1}$]: 3,100–3,000(aromatic C—H), 2,960–2,900 (aliphatic C—H), 1,750(C=O), 1,350–1,000(C—N), 820 (para-aromatic OOP)

EXAMPLE 7

Manufacture of Mixture and Element for Measuring Photoconductivity

In this example, we manufactured mixture for measuring photoconductivity and elements applying to it.

After mixing polyester polymer (poly(p-phenylene terephthalate) carbazole with a methylene spacer length 10, PPT-CZ10) produced in the above example 4, nonlinear-optical characteristic group in Formula 6 (diethylamionodicyanostyrene (DDCST)) and charge producer C$_{60}$ in Formula 4 of 64.5:35:0.5 by weight ratio, the mixture is dissolved in organic solvent to make it 5–10% by weight. And the mixture was filtrated with injection filter to remove impurities. For comparison, mixture comprising poly(N-vinyl carbazole) (PVK), DDCST, benzylbuthlphthalte (BBP), and C$_{60}$ of 48.5:35:16:0.5 by weight was filtrated through the same procedure. After dropping the filtered mixture into glass coated with two sheets of ITO electrode respectively, the mixture was heated to remove solvent. After putting together the said two sheets of glass to manufacture the mixture layer with thickness of 100 μm, we connected currents to said two ITO electrodes respectively to make elements. We inspected phase isolation of the manufactured element at room temperature for 6 months. The result of electrical conductivity of the said element, which result is shown in FIG. 2, was about 4 fold high than that of generally used PVK-applied elements.

EXAMPLE 8

Manufacture of Photo-Refractive Mixture and Element for Measuring Photo Refraction Property In this example, we manufactured photo-refractive mixture for measuring photo refraction and element applying to it.

After mixing polyester polymer produced in the above example 4 (PPT-CZ10), nonlinear-optical characteristic group in Formula 6 (DDCST) and charge producer C$_{60}$ of 64.5:35:0.5 by weight ratio, the mixture is dissolved in organic solvent to make it 5–10% by weight. And the mixture was filtrated with injection filter to remove impurities.

After dropping the filtered mixture into glass coated with two sheets of ITO electrode respectively, the mixture was heated to remove solvent. After putting together said two sheets of glass to manufacture the mixture layer with thickness of 100 μm, we connected currents to the said two ITO electrodes respectively to make elements. We inspected the phase of this element at room temperature for 6 months. The element was stabilized without phase isolation owing to rigid backbone 6 months after manufacturing.

FIG. 3 is a graph showing the analysis result of XRD(X-Ray Diffractometer) for the said manufactured photo-refractive mixture (PPT-CZ10:DDCST:C60=64.5:35:0.5 wt %) and the polymer(PPT-CZ10) The gains factor of element manufactured in this example measured with two-beam coupling was 200 cm$^{-1}$. At this time, laser used in two-beam coupling was He—Ne of 633 nm, interval between two lights was 20 degrees and intensity of applied electrical field was 4.2 kV.

EXAMPLE 9

Photo-Breakage Effect

In this example, we inspected photo-breakage effect of photo element containing photo-refractive mixture in the present invention.

On applying electrical field and irradiating light to element (PPT-CZ10:DDCST:C60=64.5:35:0.5 wt %) manufactured in the said example 8, it happened that over 65% of irradiated light was dispersed to break the light. This phenomenon happened faster with the stronger intensity of light and with the stronger intensity of electrical field. It was certified that the phenomenon is caused by photo refraction of the said element. Accordingly, the photo-element may be used in photo-breakage elements for preventing damages by strong light. FIG. 4 is a graph showing the measure results of photo-breakage effect for photo-refractive mixtures of the present invention.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

The invention claimed is:

1. A self-arrayed polymer with hole-carryability composed of the repeat-unit structure shown in formula 1 below:

Formula 1

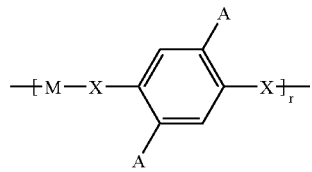

wherein A is a chromophore as a hole-carryable characteristic group, which is selected from the compound in Formula 2 or Formula 3 below:

Formula 2

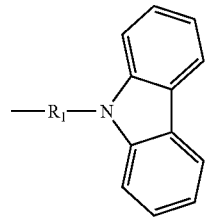

wherein $R_1$ is —O—$(CH_2)_q$— wherein q is an integer from 1 to 20, —S—$(CH_2)_m$ wherein m is an integer from 1 to 20,

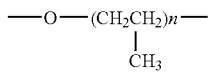

wherein n is an integer from 1 to 5,

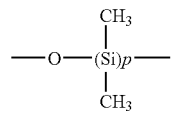

wherein p is an integer from 1 to 5; and

Formula 3

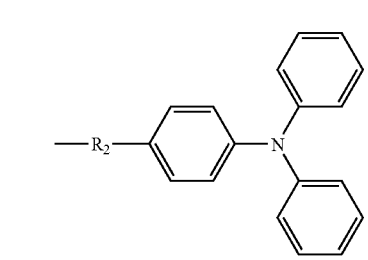

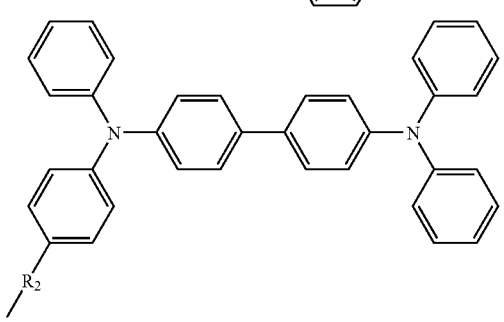

wherein R2 is —O—(CH2)v-O wherein v is an integer from 1 to 20, —S—(CH2)w-S— wherein w is an integer from 1 to 20,

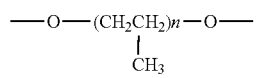

wherein n is an integer from 1 to 5 and

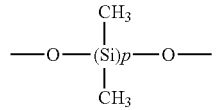

wherein p is an integer from 1 to 5;
r is an integer from 3 to 300
X is selected from

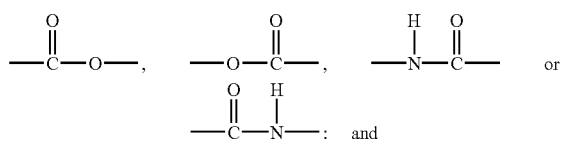

and
M is selected from 1) to 4) below as a co-monomer
1)

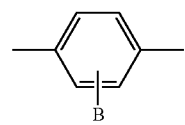

wherein b is H, Cl, Br or $CH_3$;

2)

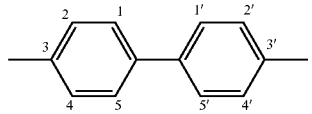

wherein said compound is 1,1'-, 2,2'-, 3,3'-, 4,4'-, 1,3'-, 1,2'-, 2,3'-, 2,4'- or 3,4'-biphenyl series isomers;

3)

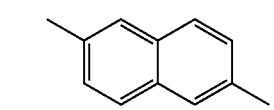

wherein said compound is 1,4-, 1,5-, 1,6-, 1,7-, 2,3-, 2,5-, 2,6- or 2,7-naphthalene series isomers; and

4)

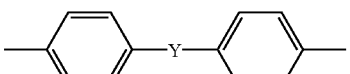

wherein Y is O, $CH_2$, $SO_2$, S,

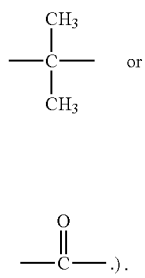

or

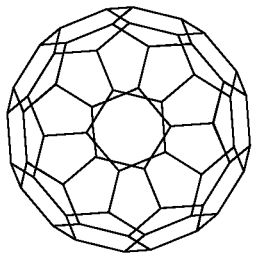

).

2. A self-arrayed polymer according to claim 1, wherein said polymer has a number average molecular weight of 2,000 to 240,000.

3. A photo-refractive mixture using host-guest series making charge producer and electro-optical material dispersed as being medium of self-arrayed polymer in claim 1.

4. A photo-refractive material according to claim 3, wherein said charge producer is composed of the structure as in below Formula 4 or 5

Formula 4

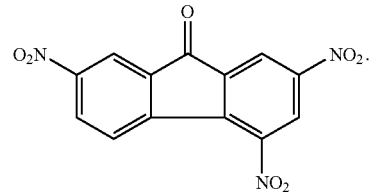

Formula 5

5. A photo-refractive material according to claim 3, wherein said electro-optical material is composed of the structure as in below Formula 6

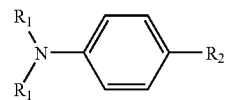

Formula 6 wherein $R_1$ is $C_1$–$C_{10}$ alkyl, $C_1$–$C_{10}$ alkyl substituted with a hydroxyl group terminal end or $C_5$–$C_{10}$ cycloalkyl; and $R_2$ is a nitro group or a dicyanovinyl group.

* * * * *

UNITED STATES PATENT AND TRADEMARK OFFICE
CERTIFICATE OF CORRECTION

PATENT NO. : 7,070,714 B2
APPLICATION NO. : 10/210335
DATED : July 4, 2006
INVENTOR(S) : Suck-Hyun Lee et al.

It is certified that error appears in the above-identified patent and that said Letters Patent is hereby corrected as shown below:

In column 2, line 40, the equation should be --  --.

In column 3, line 29, the equation should be -- 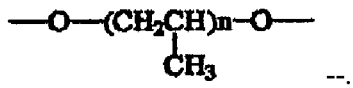 --.

In column 5, line 54, the equation should be -- 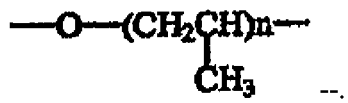 --.

In column 6, line 32, the equation should be -- 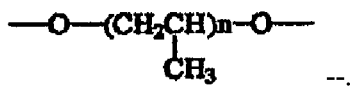 --.

In column 18, line 12, the equation should be -- 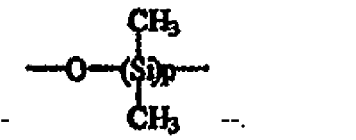 --.

In column 19, line 11, the equation should be --  --.

In column 19, line 24, claim 4 after "5" a period --.-- should be inserted.

UNITED STATES PATENT AND TRADEMARK OFFICE
CERTIFICATE OF CORRECTION

PATENT NO. : 7,070,714 B2
APPLICATION NO. : 10/210335
DATED : July 4, 2006
INVENTOR(S) : Suck-Hyun Lee et al.

It is certified that error appears in the above-identified patent and that said Letters Patent is hereby corrected as shown below:

In column 20, line 10, the equation should be -- 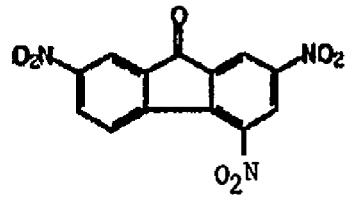 --.

Signed and Sealed this

Ninth Day of October, 2007

JON W. DUDAS
*Director of the United States Patent and Trademark Office*